US010270585B2

(12) United States Patent
Travis

(10) Patent No.: US 10,270,585 B2
(45) Date of Patent: Apr. 23, 2019

(54) CLOCK SYNCHRONIZER AND METHOD OF ESTABLISHING AN OUTPUT CLOCK

(71) Applicant: Christopher Julian Travis, Wotton-under-Edge (GB)

(72) Inventor: Christopher Julian Travis, Wotton-under-Edge (GB)

(73) Assignee: Christopher Julian Travis, Wotton-Under-Edge (GB)

( * ) Notice: Subject to any disclaimer, the term of this patent is extended or adjusted under 35 U.S.C. 154(b) by 0 days.

(21) Appl. No.: 15/698,465

(22) Filed: Sep. 7, 2017

(65) Prior Publication Data
US 2017/0373826 A1    Dec. 28, 2017

Related U.S. Application Data

(63) Continuation of application No. 15/205,126, filed on Jul. 8, 2016, now Pat. No. 9,768,949, which is a (Continued)

(51) Int. Cl.
*H03L 7/083* (2006.01)
*H03L 7/23* (2006.01)
(Continued)

(52) U.S. Cl.
CPC ............ *H04L 7/0331* (2013.01); *G06F 1/025* (2013.01); *H03K 3/0307* (2013.01); *H03L 7/07* (2013.01); *H03L 7/083* (2013.01); *H03L 7/085* (2013.01); *H03L 7/087* (2013.01); *H03L 7/0991* (2013.01); *H03L 7/0994* (2013.01); *H03L 7/0995* (2013.01); *H03L 7/10* (2013.01); *H03L 7/235* (2013.01); *G06F 2211/902* (2013.01)

(58) Field of Classification Search
CPC .... H03K 5/135; H03L 7/00; H03L 7/06–7/08; H03L 7/083; H03L 7/0991; H03L 7/0994; H03L 7/235; H03L 7/24; H04B 1/69; H04L 1/205
USPC ...... 327/141, 144–147, 155, 156; 331/2, 16, 331/17, 46–48, 50–52, 175; 375/130, 375/226, 362, 371, 373, 375, 376
See application file for complete search history.

(56) References Cited

U.S. PATENT DOCUMENTS 4,652,832 A    3/1987 Jasper
4,888,564 A    12/1989 Ishigaki
(Continued)

FOREIGN PATENT DOCUMENTS

EP    0526227    2/1993
EP    0698968    2/1996
(Continued)

OTHER PUBLICATIONS

International Search Report; International Application No. PCT/GB2003/001441; International Filing Date: Apr. 2, 2003; dated May 11, 2013; 6 Pages.
(Continued)

*Primary Examiner* — Levi Gannon
(74) *Attorney, Agent, or Firm* — Cantor Colburn LLP

(57) ABSTRACT

A hybrid numeric-analog clock synchronizer for establishing a clock or carrier locked to a frequency reference. The clock synchronizer is typically a clock multiplier and a jitter attenuator. The reference may have a low update rate. The synchronizer achieves high jitter rejection, low phase noise and wide frequency range. It can be integrated on chip.

23 Claims, 12 Drawing Sheets

Related U.S. Application Data continuation of application No. 14/106,229, filed on Dec. 13, 2013, now Pat. No. 9,407,429, which is a continuation of application No. 13/041,578, filed on Mar. 7, 2011, now Pat. No. 8,618,886, which is a continuation of application No. 12/352,157, filed on Jan. 12, 2009, now Pat. No. 7,924,099, which is a continuation of application No. 10/552,364, filed as application No. PCT/GB03/01441 on Apr. 2, 2003, now Pat. No. 7,495,516.

(51) Int. Cl.

| | |
|---|---|
| *H04L 7/033* | (2006.01) |
| *G06F 1/025* | (2006.01) |
| *H03L 7/07* | (2006.01) |
| *H03L 7/085* | (2006.01) |
| *H03L 7/087* | (2006.01) |
| *H03L 7/099* | (2006.01) |
| *H03K 3/03* | (2006.01) |
| *H03L 7/10* | (2006.01) |

(56) References Cited

U.S. PATENT DOCUMENTS

| | | | |
|---|---|---|---|
| 4,901,265 | A | 2/1990 | Kerr et al. |
| 4,970,474 | A | 11/1990 | Kennedy et al. |
| 5,394,106 | A | 2/1995 | Black et al. |
| 5,432,827 | A | 7/1995 | Mader |
| 5,625,358 | A | 4/1997 | Wilson et al. |
| 5,638,010 | A | 6/1997 | Adams |
| 5,790,614 | A | 8/1998 | Powell |
| 5,825,253 | A | 10/1998 | Mathe et al. |
| 5,977,804 | A | 11/1999 | Beech |
| 5,986,512 | A | 11/1999 | Eriksson |
| 6,075,474 | A | 6/2000 | Gabet et al. |
| 6,094,569 | A | 7/2000 | Wang |
| 6,262,604 | B1 | 7/2001 | Gabet et al. |
| 6,396,313 | B1 | 5/2002 | Sheen |
| 6,611,175 | B2 | 8/2003 | Heymann |
| 6,674,332 | B1 | 1/2004 | Wunner et al. |
| 6,741,109 | B1 | 5/2004 | Huang et al. |
| 6,833,764 | B1 | 12/2004 | Dean |
| 7,010,074 | B2 | 3/2006 | Nakamura |
| 2002/0135480 | A1 | 9/2002 | Frederick et al. |
| 2002/0191724 | A1 | 12/2002 | Bleisteiner et al. |
| 2003/0063701 | A1 | 4/2003 | Eubanks |
| 2006/0267640 | A1 | 11/2006 | Travis |
| 2009/0121792 | A1 | 5/2009 | Travis |
| 2011/0156820 | A1 | 6/2011 | Travis |
| 2014/0105345 | A1 | 4/2014 | Travis |
| 2016/0323095 | A1 | 11/2016 | Travis |

FOREIGN PATENT DOCUMENTS

| | | |
|---|---|---|
| EP | 1104111 | 5/2001 |
| EP | 1160984 | 12/2001 |
| WO | 9426033 | 11/1994 |
| WO | 9933182 | 1/1999 |
| WO | 0018008 | 3/2000 |

OTHER PUBLICATIONS

International Preliminary Examination Report; International Application No. PCT/GB2003/001441; International Filing Date: Apr. 2, 2003; dated Jul. 29, 2005; 21 Pages.

J. Rode, et al., Fractional-N Direct Digital Frequency Synthesis with a 1-Bit Output; IEEE, Jun. 11-16, 2006, pp. 415-418.

CLOCK SYNCHRONIZER AND METHOD OF ESTABLISHING AN OUTPUT CLOCK

CROSS REFERENCE TO RELATED APPLICATIONS

This application is a continuation of U.S. Continuation application Ser. No. 15/205,126, filed Jul. 8, 2016, which is a continuation of U.S. Continuation application Ser. No. 14/106,229 (now U.S. Pat. No. 9,407,429), filed Dec. 13, 2013, which is a Continuation of U.S. application Ser. No. 13/041,578 (now U.S. Pat. No. 8,618,886), filed Mar. 7, 2011, which is a Continuation of U.S. application Ser. No. 12/352,157 (now U.S. Pat. No. 7,924,099), filed Jan. 12, 2009, which is a Continuation of U.S. application Ser. No. 10/552,364 (now U.S. Pat. No. 7,495,516), filed Jun. 9, 2006, which is a National Stage Application of PCT/GB03/01441 filed on Apr. 2, 2003. The contents of U.S. application Ser. No. 15/205,126, U.S. application Ser. No. 14/106,229, U.S. application Ser. No. 13/041,578, U.S. application Ser. No. 12/352,157, U.S. application Ser. No. 10/552,364, and PCT/GB03/01441 are incorporated by reference herein in their entirety.

FIELD OF THE INVENTION

The present invention relates to the establishment of clocks and carriers that are phase/time locked, frequency locked or frequency ratio locked to timing reference signals.

BACKGROUND OF THE INVENTION

In electronic systems, clocks and carriers abound. They are the heartbeat of synchronous circuits such as microprocessors. They are used to construct communications signals for transmission, and to recover data from received signals. They regulate the sampling of continuous-time signals, and the conversion of discrete-time signals into continuous-time form. They are modulated to carry information in elevated frequency bands, and are instrumental in demodulation.

Clock quality has a direct bearing on system performance, e.g. operating margin, signal-to-noise ratio, spectral efficiency etcetera. Applications involving e.g. digital audio signals or radio-frequency communications can place particularly stringent limits on clock jitter and carrier phase noise. Aspects relating to flexibility and cost are also very important in most applications.

It is a common desire or requirement that a clock be synchronized to another clock, or to a timing reference of more general form. This applies for example when digital audio and video signals are communicated in real time. The design of clock synchronizing circuits is an established field, and many types of clock synchronizer are known within the art. Examples include various classes of phase-locked loop (PLL), direct digital synthesizer (DDS) and anti-jitter circuit (AJC).

Clock synchronization encompasses phase locking, frequency locking and frequency ratio locking. Hence it includes reference-locked frequency synthesis.

In phase-locked loops, the clock is provided by a controllable oscillator that is pulled into lock by the action of feedback. The feedback path optionally includes a frequency divider. A phase detector compares the divided clock with the timing reference, and generates an error signal representing their phase offset. This error signal drives a loop filter, the output of which is connected to the oscillator's frequency control port.

Below the PLL's closed-loop corner frequency, jitter on the timing reference passes straight to the clock. Above its corner frequency, the oscillator's intrinsic jitter passes straight to the clock. In setting the loop bandwidth the designer must find a compromise between the need for good reference jitter attenuation and the need for low PLL intrinsic jitter. If a high-Q oscillator is used, such as a voltage-controlled crystal oscillator (VCXO), the PLL can have narrow bandwidth and low jitter. However, VCXOs can be pulled only over a narrow frequency range. Also, they are relatively expensive and cannot be implemented on chip. Conversely, low-Q oscillators such as ring oscillators have wide frequency range and are fully integrable, but their high self-noise and their sensitivity to interference makes them only suited to use in wide-bandwidth PLLs.

When the timing reference is clean and fast, there is no problem with using a wide-bandwidth PLL. This is the case in many standalone frequency synthesizers, for example, where the reference is typically a local crystal oscillator. However, it is not the case in most other applications. The timing reference is often a low-rate signal, e.g. because of limited capacity in the channel from the timing master. Also it is often of relatively low quality, due to imperfect characteristics of that channel.

Frame locking is also a requirement in many systems. This too has tended to keep the rate of timing reference signals down. Many de-facto timing references consist only of a framing component, on the basis that this is all that is needed. Frame rates are often quite low, e.g. 8 kHz in telecom systems.

One way of constructing a clock synchronizer that can meet the conflicting requirements outlined above would be to make use of direct digital synthesis (DDS). In direct digital synthesizers a numeric oscillator generates a digital representation of a sinewave which is then passed through a digital-to-analog converter (DAC), filtered to remove spuriae, and compared with a DC value to create the desired squarewave. However, DDS is not without problems. One is the cost of the DAC. Others relate to finite wordlength effects, inadequate reconstruction filtering, and susceptibility to interference at the point where the sinewave is turned into a squarewave.

The cost of the DAC, the filter and the comparator can be avoided by taking the sign of the numeric oscillator's output, and using that as the clock. However, such number-controlled oscillators (NCOs) suffer greatly from beat-frequency effects. Superior number-controlled oscillators are known within the art, but even they have certain shortcomings. Wholly numeric PLLs constructed around such oscillators generally suffer from an excess of high-frequency jitter, compared with analog PLLs. On the other hand, they are easy to test, need no calibration, have great repeatability, and present the opportunity to add many advanced features at little incremental cost. For example, accurate frequency holdover is straightforward with numeric PLLs, and rapid locking, e.g. by bandwidth adaption, poses far fewer problems than in analog.

An object of the invention may include one or several of the below-stated provisions of:

A clock synchronizer/synthesizer that has high performance, high flexibility and low implementation cost.

A clock synchronizer/synthesizer that achieves the high performance of VCXO-based PLLs without incurring the cost of a VCXO.

A clock synchronizer/synthesizer that has less low-frequency intrinsic jitter (close-in phase noise) than VCXO-based PLLs.

A clock synchronizer/synthesizer that has narrow bandwidth, low intrinsic jitter and a wide range of operating frequencies.

A narrow-bandwidth low-jitter wide-range clock synchronizer/synthesizer that can smoothly track large changes in reference frequency.

A ring-oscillator-based clock synchronizer/synthesizer that has higher performance than previous ring-oscillator-based clock synchronizers/synthesizers.

A clock synchronizer/synthesizer that is readily integrable on chip using common processes and building blocks.

A clock synchronizer/synthesizer that is less sensitive to interference and layout than previous clock synchronizers.

A clock synchronizer/synthesizer that combines the good features of numeric PLLs with the good features of analog PLLs.

A clock synchronizer/synthesizer that achieves the performance and flexibility of DDS-based clock synchronizers without incurring the cost of a DAC.

SUMMARY OF THE INVENTION

The invention relates to a method of establishing an output clock signal (OC) on the basis of an input frequency reference (TR), said method comprising the steps of
attenuating jitter of said frequency reference (TR) to produce a control signal (103),
providing at least one intermediate clock signal (IC) on the basis of said control signal (103), at least one of said intermediate clock signals (IC) being justified to a local clock (LC) and being spectrum controlled, and
providing said output clock signal (OC) on the basis of said at least one intermediate clock signal (IC) by attenuating jitter of said at least one intermediate clock signal (IC), wherein said local clock (LC) is derived from said output clock (OC).

According to the invention several advantages may been obtained, such as high quality output clock signals provided by a circuit, which may be integrated on-chip high flexibility with respect to the nature of the frequency reference has been obtained. According to the invention, a great variety of input frequencies may be locked to due to the fact the generation of different frequencies is not directly derived from a reference oscillator clock.

low cost implementation. The components, e.g. a numeric clock renderer being a fractional frequency divider adapted for the purpose of generating the intermediate clock on the basis of the frequency reference are by nature low-cost components, which may moreover be integrated on-chip. The components adapted for attenuating the jitter, typically the intrinsic jitter of the numeric clock renderer may also comprise relatively simple and low cost components in the sense that requirements to the bandwidth of the out filters are relatively relaxed in the sense that the intrinsic noise of the circuit according to the invention has been spectrum controlled previously to the final attenuation of the (typically intrinsic) jitter According to a preferred embodiment of the invention, on-chip design may be facilitated by the fact that the analog filters may be implemented by means of relatively small-value components in combination with a numeric oscillator, which by nature is well suited for on-chip implementation.

In this context it should be noted that numeric oscillators and small-value analog components per se are low-cost components.

When at least a part of the jitter of said at least one intermediate clock signal (IC) comprises justification jitter (JJ) originating from said justification to said local clock (LC), a further advantageous embodiment of the invention has been obtained.

When said justification and spectrum control is performed numerically, a further advantageous embodiment of the invention has been obtained.

When said attenuation of jitter of said frequency reference (TR) is performed by using low-pass filtering, a further advantageous embodiment of the invention has been obtained.

When said justification is performed by means of a number-controlled oscillator i.e. fractional frequency divider (NCO), a further advantageous embodiment of the invention has been obtained.

When a control input of said fractional frequency divider (NCO) comprises a period control input, a further advantageous embodiment of the invention has been obtained When whereby said spectrum control comprises noise shaping, a further advantageous embodiment of the invention has been obtained.

When at least a part of said justification jitter (JJ) is biased into a higher frequency band, a further advantageous embodiment of the invention has been obtained.

When said justification jitter (JJ) is low-pass filtered by means of a second block (SBLK), which preferably comprises a phase-locked loop, a further advantageous embodiment of the invention has been obtained.

When said second block (SBLK) produces a multiplied clock, a further advantageous embodiment of the invention has been obtained.

When each of said intermediate clock signals (IC) is established by means of at least one numeric stage (FBLK), a further advantageous embodiment of the invention has been obtained According to this preferred embodiment of the invention, the intermediate clock signal is provided by means of a relatively simple, cost-effective and most of all flexible numeric stage on the basis of numeric control.

By applying a numerically controlled input stage, the circuit may receive and lock to frequencies in a relatively broad frequency band. Evidently, such feature is of a great importance, if the current application e.g. requires different sampling frequencies, which may hardly be obtained on the basis of the same reference frequency.

According to this preferred embodiment of the invention a numeric stage should preferably comprise a number-controlled oscillator, i.e. a fractional frequency divider.

When said attenuating jitter of said at least one intermediate clock signal (IC) is performed by means of at least one analog stage (SBLK), a further advantageous embodiment of the invention has been obtained.

When said at least one analog stage (SBLK) is adapted for attenuating jitter partly or mainly originating from said at least one numeric stage (FBLK), a further advantageous embodiment of the invention has been obtained.

When each of said intermediate clock signals (IC) is justified to a corresponding local clock (LC) and justification jitter associated with said justification to said local clock (LC) is spectrum controlled, a further advantageous embodiment of the invention has been obtained.

When said spectrum control comprises noise shaping, a further advantageous embodiment of the invention has been obtained.

When said spectrum control comprises dithering and noise shaping, a further advantageous embodiment of the invention has been obtained.

When said clock synchronizer further comprises a circuit for attenuating jitter of an input timing reference (TR), and said circuit comprises a number-controlled oscillator (NCO) adapted for establishment of an intermediate clock signal (IC) on the basis of said input timing reference (TR), a further advantageous embodiment of the invention has been obtained.

When said clock synchronizer further comprises jitter filtering means (SBLK) adapted for providing said output clock signal (OC) on the basis of said intermediate clock signal (IC), a further advantageous embodiment of the invention has been obtained.

When said output clock signal (OC) is frequency locked to said input timing reference (TR), a further advantageous embodiment of the invention has been obtained.

When said output clock signal (OC) is frequency ratio locked to said input timing reference (TR), a further advantageous embodiment of the invention has been obtained.

BRIEF DESCRIPTION OF THE FIGURES

The invention will now be described with reference to the figures, where.

DETAILED DESCRIPTION

Some Applications

Figure 1A:
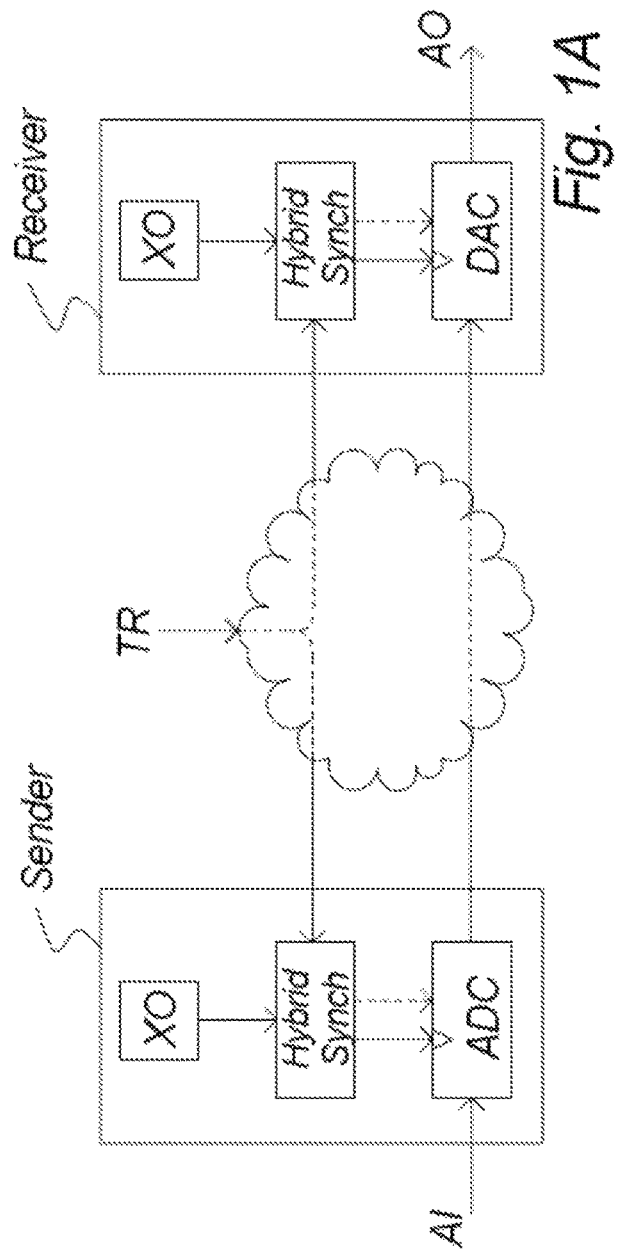
FIG. 1A-1B show two applications implementing the Hybrid Synchronizer of the present invention.
Figure 1B:
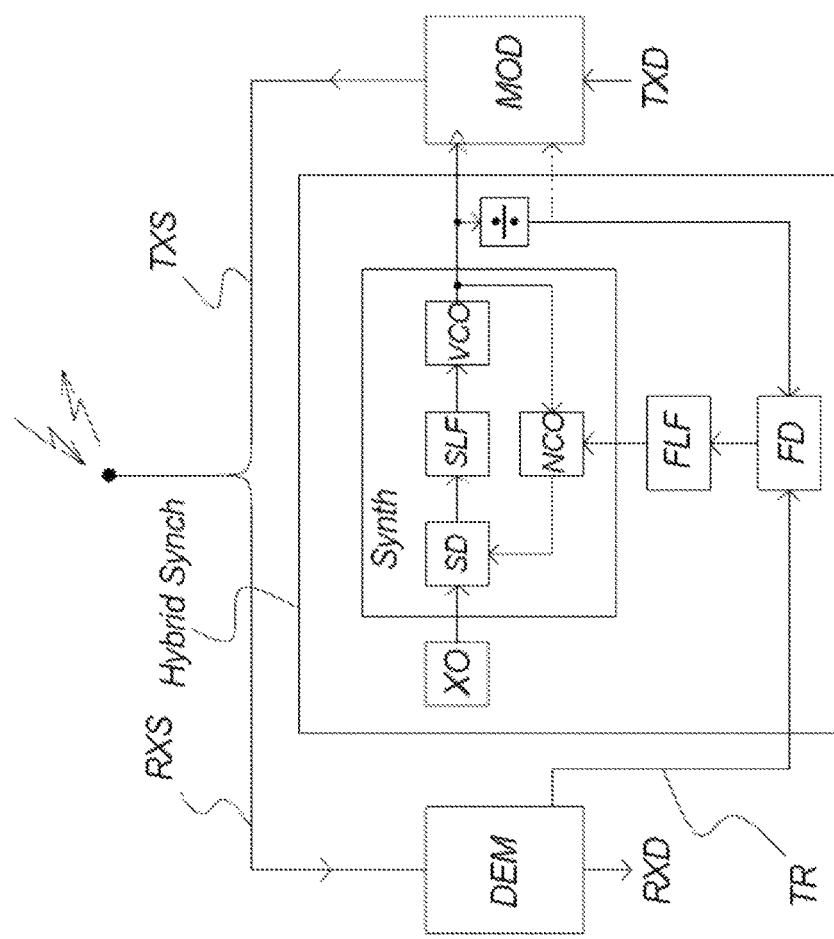

FIGS. 1A and 1B show two different applications implementing the hybrid numeric-analog clock synchronizer (Hybrid Synchronizer) of the present invention. The drawings are provided exclusively to show contextually examples of the present invention, and it is emphasized that the Hybrid Synchronizer of the present invention targets a wide range of applications from many different technical areas, and should not be restricted to the use shown in FIG. 1A, FIG. 1B or any other drawing provided with this description.

FIG. 1A shows an example of digital communication. It comprises a sender with an analog-to-digital converter ADC and a receiver with a digital-to-analog converter DAC. The ADC has an analog input AI, and the DAC has an analog output AO. The digitized signal from the ADC is routed to the DAC via a communications channel. The channel may be a wired or wireless link, bus, network etc. and may involve coding, packetization, buffering etc. The analog information on the analog input signal AI is transmitted as a digitized signal, and then output as analog information at the signal AO. To ensure that the analog output AO equals the analog input AI, it is important that the clocks used by the ADC and the DAC are synchronized and have a low amount of jitter noise. This synchronization and low jitter is achieved flexibly and at low cost by using a Hybrid Synchronizer of the present invention to provide the clock, and optionally a framing component, to each converter. The two Hybrid Synchronizers are referred to a common timing reference signal TR, which is always a frequency reference and may also be a phase reference. Each Hybrid Synchronizer also requires a stable clock, which is typically provided by a local free-running crystal oscillator XO, possibly via e.g. a clock multiplier or a delay-locked loop.

In the example of FIG. 1A the timing reference is provided by a separate device, not shown. Similar examples arise when it is instead provided by the receiver or by the sender. In the latter case the timing reference may be implicit in the digitized signal. It is further noted that the receiver may be one of several that are all receiving the same digital signal, e.g. in a broadcasting context, and that senders and receivers that can play back and store digital signals do not necessarily contain analog converters.

FIG. 1B shows an example of a transceiver, e.g. in a cable modem or a mobile phone. It comprises a modulator MOD for modulating data for transmission TXD to a transmission signal TXS, and a demodulator DEM for demodulating a received signal RXS to received data RXD. The transceiver is communicating with e.g. a base station (not shown). The signal for transmission is modulated according to a reference clock, which may for example be defined and maintained by the base station. A representation of that reference is inherent in the received signal RXS, and is thereby immediately present to the demodulator DEM. The extracted representation TR may possibly be in a poor condition, and suffering from jitter noise etc. To derive a high quality clock here from, for use with the modulator MOD, a Hybrid Synchronizer of the present invention is inserted. The extracted representation is used as input for the Hybrid Synchronizer, which locks to it, attenuates jitter and provides a high quality clock or carrier of appropriate frequency/phase, plus optional framing component, to the modulator MOD. More generally, the Hybrid Synchronizer might take part in the modulation process, e.g. implementing frequency hopping or phase modulation.

The motivation for locking the transceiver to the reference might be to tightly synchronize transmission to reception, which can allow more efficient use of the channel. Or, where transmission and reception are plesiochronous, the motivation might simply be to avoid the need for a close-tolerance reference oscillator in the transceiver.

Hybrid Numeric-Analog Clock Synchronization

A clock synchronizer according to an embodiment of the present invention has a first block FBLK including a low-pass filter FLF, which attenuates mid- and high-frequency jitter from a received frequency reference TR, and a second block SBLK, which attenuates high-frequency jitter from the first block. The first block FBLK outputs one or more intermediate clocks IC to the second block SBLK. The edges of each intermediate clock IC are justified to edges or interpolated phases of a local clock LC. A process in the first block controls the spectrum of the associated justification jitter, by noise shaping. The second block SBLK generates an output clock OC. The clock synchronizer acts to lock this output clock OC to the frequency reference TR. Within the scope of such locking and synchronization are included phase/time locking, frequency locking and frequency ratio locking. In many applications, the output clock OC is a composite clock including a framing component OFS, which may be part of a time count. The clock synchronizer can lock this component to the timing reference TR. Generally, at least a part of the first block FBLK is numeric and operates in discrete time, and at least a part of the second block SBLK is analog and operates in continuous time.

Such a synchronizer may be referred to as a hybrid numeric-analog clock synchronizer, or just as a Hybrid Synchronizer.

Figure 2:
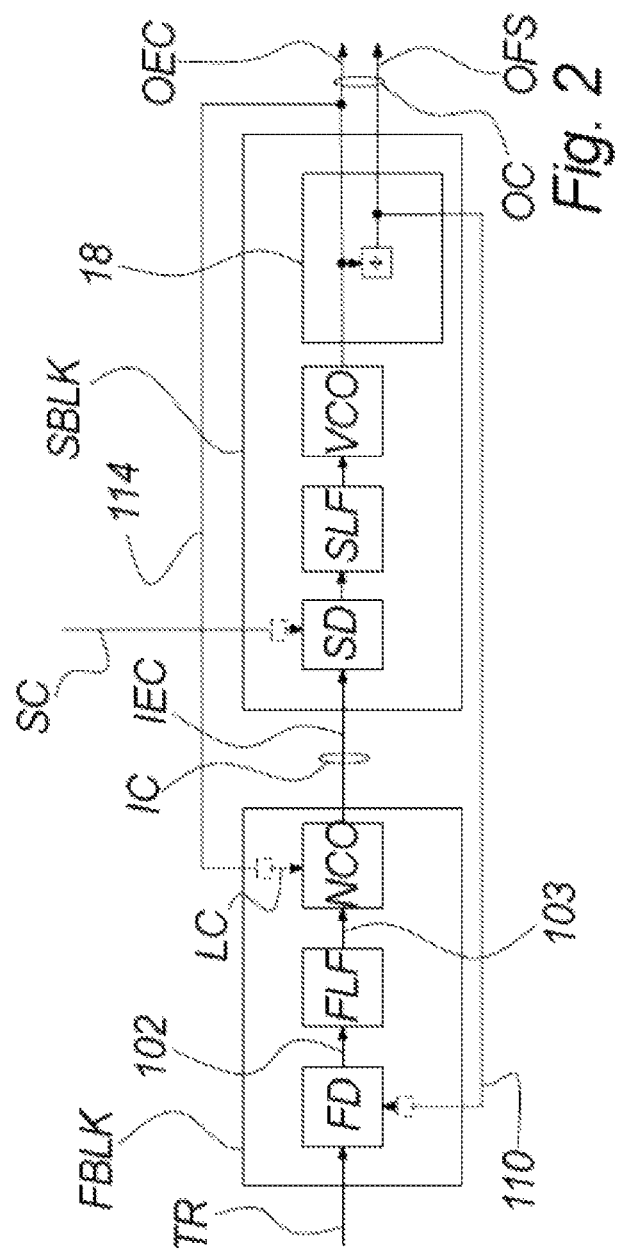
FIG. 2 shows a detailed embodiment of the Hybrid Synchronizer.

FIG. 2 shows an embodiment of the Hybrid Synchronizer of the present invention. The first block FBLK comprises a first detector FD, a first loop filter FLF and a fractional frequency divider NCO. The second block SBLK comprises a second detector SD, a second loop filter SLF, and a voltage-controlled oscillator VCO.

The first and second detectors FD, SD may be phase detectors, time detectors, frequency detectors, or any similar detectors. The first and second loop filters FLF, SLF are low-pass filters that may or may not have an integrating behaviour.

In these and other embodiments, the voltage-controlled oscillator VCO may be substituted by a current-controlled oscillator or any other oscillator that is wholly or largely analog.

In some embodiments of the Hybrid Synchronizer of the present invention, the output clock OC is a composite signal comprising an output event clock OEC, and an output frame sync OFS. These components may each have their own separate wiring, or may be modulated into one composite signal, e.g. by using one or more of several possible conventional techniques. In RF applications the output event clock OEC may be e.g. sinusoidal rather than rectangular.

Also the signal connecting the two blocks, the intermediate clock IC, may possibly and preferably comprise an intermediate event clock component IEC. It is noted that any suitable signal implementation may be used for the output clock OC and the intermediate clock IC, and that the implementations of each do not need to be the same. It is further noted that the intermediate event clock IEC may be a multi-part event clock on multiple wires.

The embodiment of FIG. 2 has the output event clock OEC fed back to the fractional frequency divider NCO, where it is used as local clock LC.

The frequency reference TR may take many forms, including irregular forms such as MPEG-2 Systems program/system clock references, which are streams of reference timestamp values. The first detector's feedback signal 110 may also take many forms.

Additional stages such as frequency dividers, saturation limiters, quantizers, ADCs and DACs can be inserted at various places in the embodiment shown in FIG. 2 without affecting the basic operation or novelty of the circuit.

In addition to the Hybrid Synchronizer form illustrated in FIG. 2, other forms are possible, still within the scope of the present invention. Such forms may be derived e.g. by adding a second fractional frequency divider to the circuit.

In preferred embodiments, the first block FBLK is entirely numeric, and the second block SBLK is partly digital and partly analog. Specifically, the second detector is preferably digital and the second loop filter SLF is preferably of the integrator-plus-lead-lag type, incorporating at least one charge pump and a passive RC network. With preferred embodiments the Hybrid Synchronizer of the present invention might be designed so that most of the second block SBLK is exactly as required by a conventional single-stage PLL, thus making it available as pre-designed blocks.

For applications that do not require phase/time locking, a preferred embodiment uses a frequency detector for the first detector FD, e.g. a simple period-measuring counter.

The first block has three inputs; the frequency reference TR, a first feedback signal 110 from the second block SBLK, and the local clock LC, which is a second feedback signal 114 from the second block SBLK. As in conventional PLLs, the feedback path 110 optionally includes a frequency divider.

Within the first block FBLK, the first detector FD is preferably a time detector. It outputs a digital or analog signal representing the time offset between the timing reference TR and the feedback signal 110. This detector's output 102 is run through the first loop filter FLF and then used as a control signal 103 for the fractional frequency divider NCO. By processing the output event clock OEC, the fractional frequency divider NCO generates the intermediate event clock IEC with mean relative period according to the control signal 103.

The second block takes the intermediate event clock IEC as input. This is connected to the second detector SD, which is preferably a phase detector, and which compares the intermediate event clock IEC with the stable clock SC. This results in a control signal, which is sent through the second loop filter SLF and then used to control the voltage-controlled oscillator VCO. The output of the VCO is the output event clock OEC, thus controlled via the intermediate event clock IEC. The output event clock OEC is used as feedback 114 to the first block FBLK, and also—in this embodiment—as input to a divider block 18, where it is divided to create an output frame sync OFS. The feedback signal 110 communicates the output clock OC to the first detector FD. The stable clock SC is preferably sourced from a crystal oscillator, either directly or indirectly.

For applications that do not require phase/time locking, a frequency detector may be used as first detector FD. The divider in the divider block may be configured to divide by one.

Mode of Operation

In the following is described the mode of operation of the Hybrid Synchronizer of the present invention. The first block FBLK locks to and typically multiplies the frequency reference TR, and attenuates mid- and high-frequency jitter. By choosing a low corner frequency for the first block, e.g. 10 Hz, most of the phase noise on the frequency reference TR is filtered away. The first block establishes a feedback loop, which may be referred to as the outer feedback loop or the numeric loop. Its bandwidth is set largely by the first loop filter FLF. By not using an expensive and inflexible voltage-controlled crystal oscillator (VCXO) or similar, the fractional frequency divider NCO however injects its own significant amount of phase noise, i.e. jitter. The dominant mechanism for this is typically the process of justifying (i.e. aligning) the edges of the generated clock IC to edges or interpolated phases of the master clock LC. For this reason the jitter is referred to as justification jitter. The justification jitter is known to us, and is at least partly controllable. One method of controlling it is to perform jitter spectrum shaping and smoothing within the fractional frequency divider.

The second block SBLK locks to and optionally multiplies the intermediate clock IC, and attenuates high-frequency jitter. As the fractional frequency divider preferably uses a jitter spectrum shaping where the justification jitter is biased towards high frequencies, a relatively high corner frequency can be chosen for the second block, e.g. 100 kHz. The second block establishes a feedback loop, which may be referred to as the inner feedback loop or the analog loop. Its bandwidth is set largely by the second loop filter SLF. The second block SBLK preferably uses a voltage-controlled oscillator VCO such as a ring oscillator, which is cheap, has a wide frequency range and is integrable on chip. This also permits the use of conventional and pre-designed building blocks for the second block. Unfortunately this kind of oscillator also adds a further amount of jitter to the signal. This VCO intrinsic jitter is however easily attenuated by feeding back the signal. Using the second loop filter SLF to remove both the justification jitter and the VCO jitter necessitates a compromise for the characteristics of this filter. To filter away the justification jitter, a narrow low-pass filter does best, but to filter away the VCO jitter a wide filter does best, as it is positioned in the feedback path of the VCO. In fact a hard feedback with a closed-loop gain of 1 is the best method to target the VCO jitter.

The Hybrid Synchronizer of the present invention behaves differently to jitter injected at various points in the circuit, and in various frequency bands. The four most significant jitter sources are the frequency reference TR, the fractional frequency divider NCO, the stable clock SC and the voltage-controlled oscillator VCO. The two most significant parameters affecting jitter attenuation are the bandwidth of the outer feedback loop and the bandwidth of the inner feedback loop. With an outer-loop bandwidth of e.g. 10 Hz and an inner-loop bandwidth of e.g. 100 kHz, three distinct frequency bands exist.

In the lowest band, e.g. below 10 Hz, the Hybrid Synchronizer tracks its frequency reference TR and the justification jitter. However, the justification jitter can be made insignificant in this band by exercising appropriate control of its spectrum within the fractional frequency divider. Jitter from the stable clock SC is attenuated by the action of feedback around the outer loop. VCO jitter is heavily attenuated by the action of feedback around the inner loop. Consequently low-frequency jitter on the frequency reference TR can be the most significant jitter let through to the output OC.

In the middle band, e.g. 10 Hz to 100 kHz, the justification jitter and any jitter on the stable clock SC both pass to the output OC without attenuation. It is for this reason that the stable clock SC is preferably sourced from a crystal oscillator. Jitter from the frequency reference TR is attenuated by the first loop filter FLF, and VCO jitter is attenuated by feedback around the inner loop.

In the highest band, e.g. above 100 kHz, it is the VCO jitter that passes straight to the output OC. However, the negative slope of the VCO jitter spectrum does help to moderate its contribution in this band. Jitter from the frequency reference TR is heavily attenuated by the first loop filter FLF. The justification jitter and any jitter on the stable clock SC are both attenuated by the second loop filter SLF. Note that the Hybrid Synchronizer has the prospect of lower close-in phase noise and lower vibration sensitivity than VCXO-based PLLs. There are two reasons for this. The first is that the crystal oscillator that generates the stable clock SC can be a free-running one. The second is that it can use a crystal that has been cut for high Q rather than frequency accuracy over a range of temperatures.

Jitter Spectra

FIGS. 3A-3E show results achieved by simulating the Hybrid Synchronizer of the present invention under different conditions. All of these figures are graphs depicted in the same double logarithmic coordinate system, with frequency measured in Hertz on the x-axis and jitter on the y-axis. Each of these figures comprises five curves: the spectral density of the Hybrid Synchronizer's intrinsic output jitter OJ, the spectral density of the justification jitter JJ, the spectral density of the filtered justification jitter FJJ, the spectral density of the VCO jitter VJ and the spectral density of the filtered VCO jitter FVJ.

The intrinsic output jitter OJ is measured at the output of the Hybrid Synchronizer of the present invention, the justification jitter JJ is measured across the fractional frequency divider NCO with its control input held static, and the VCO jitter VJ is measured at the output of the voltage-controlled oscillator VCO with its control input held static. The filtered justification jitter FJJ is that part of the output jitter OJ originating from the justification jitter JJ, and the filtered VCO jitter FVJ is that part of the output jitter originating from the VCO jitter VJ.

The only differences between the simulations are the order of noise shaping carried out within the fractional frequency divider NCO, and the corner frequency of the inner feedback loop.

Figure 3A:
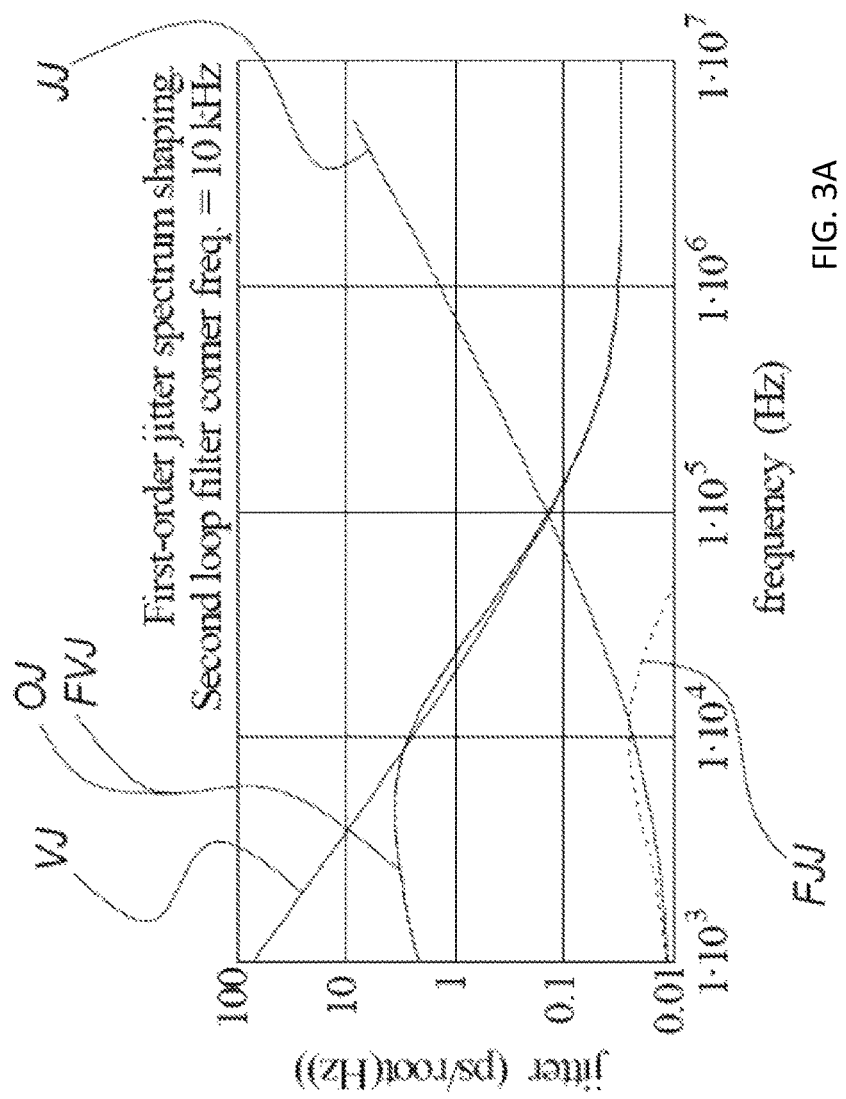
FIG. 3A-3E show jitter spectra from the Hybrid Synchronizer when different levels of noise shaping and different analog-loop corner frequencies are used.
Figure 3B:
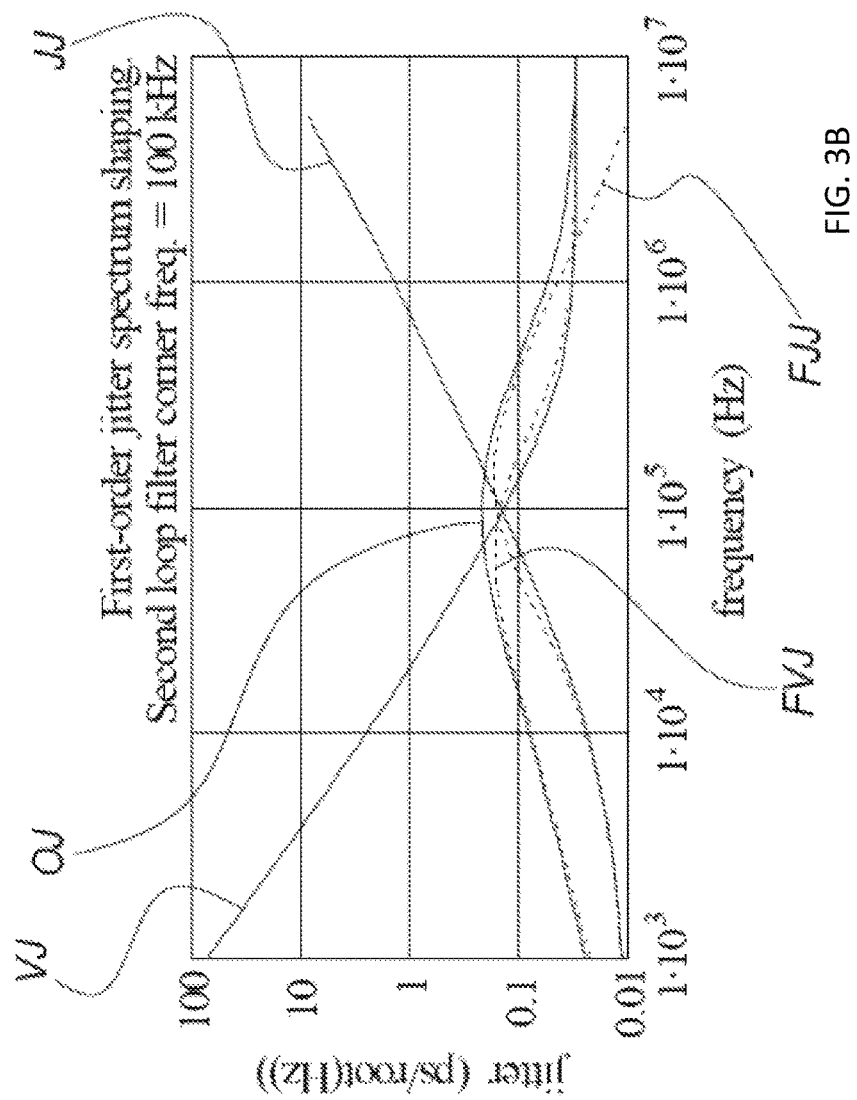

FIGS. 3A and 3B are the results of performing first-order noise shaping (in a fractional frequency divider of the type shown in FIG. 5), and using inner-loop corner frequencies of 10 kHz and 100 kHz. The justification jitter JJ is the same for both simulations, as it is only affected by the order of noise shaping. It is easy to see the effect of noise shaping, as the justification jitter is much greater at higher frequencies. The VCO jitter is also the same for both simulations, as it is not affected by any of the variable parameters in this simulation. As seen, the VCO jitter is worse for low frequencies.

The filtered justification jitter FJJ is the result of sending the justification jitter JJ through the second block SBLK comprising a loop filter SLF with effective low-pass corner frequency of 10 kHz or 100 kHz respectively. Because of the positive slope of the justification jitter spectrum JJ, the peak density of the filtered justification jitter FJJ increases with the effective corner frequency of the loop filter SLF.

The filtered VCO jitter shows the result of the feedback loop 114 and the second loop filter SLF. Because of the negative slope of the VCO jitter spectrum, the peak density of the filtered VCO jitter FVJ decreases when the effective corner frequency of the second loop filter SLF is increased. As this behaviour is the opposite of the behaviour of the filtered justification jitter, this suggests that a balance between the filtering of the justification jitter and the filtering of the VCO jitter has to be found.

As seen from the output jitter graph OJ, the best result of the two simulations with first-order noise shaping is FIG. 3B, where the corner frequency of the inner feedback loop is 100 kHz.

Figure 3C:
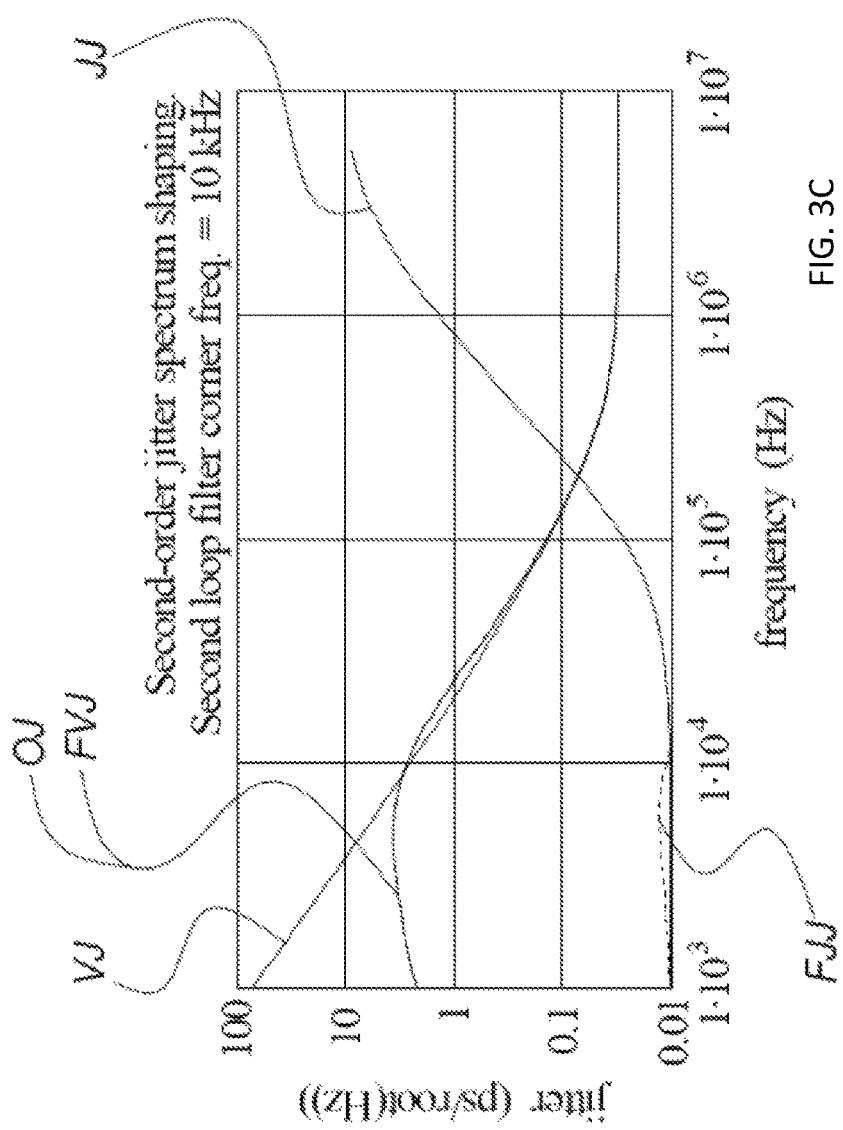
Figure 3D:
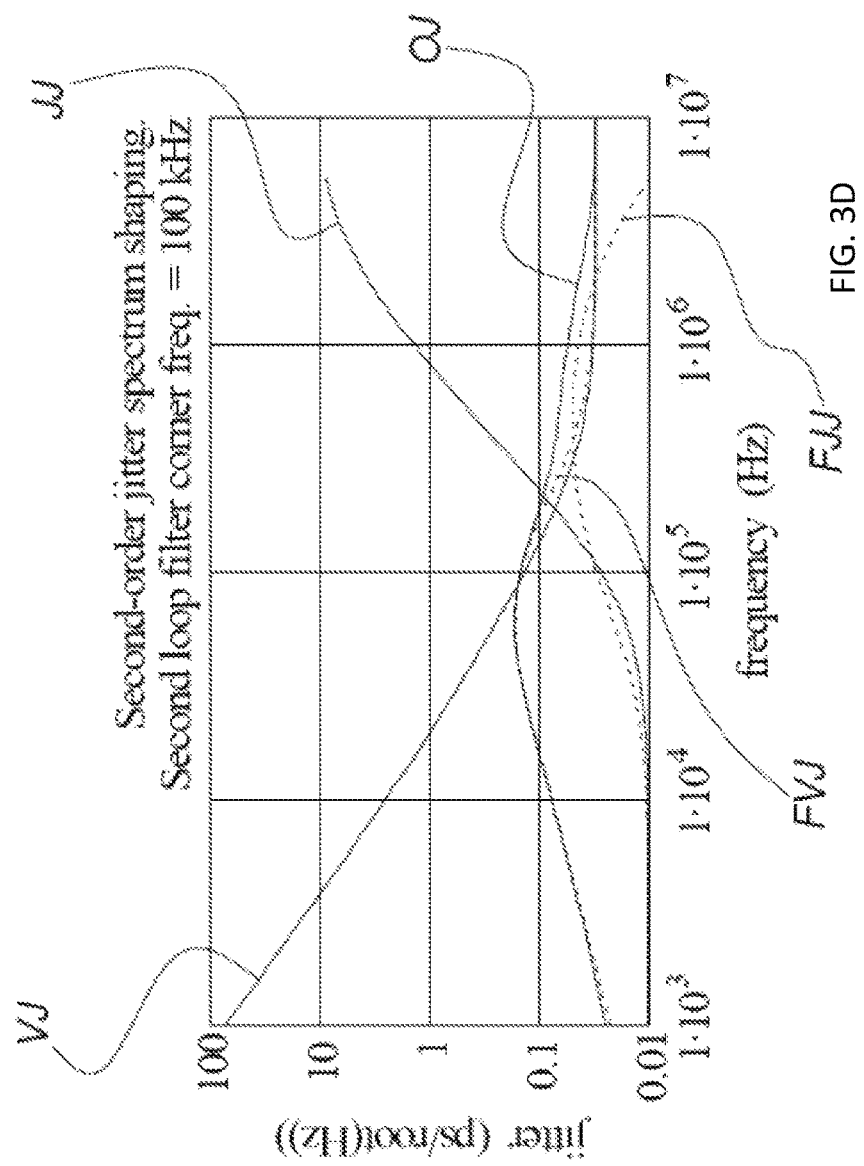
Figure 3E:
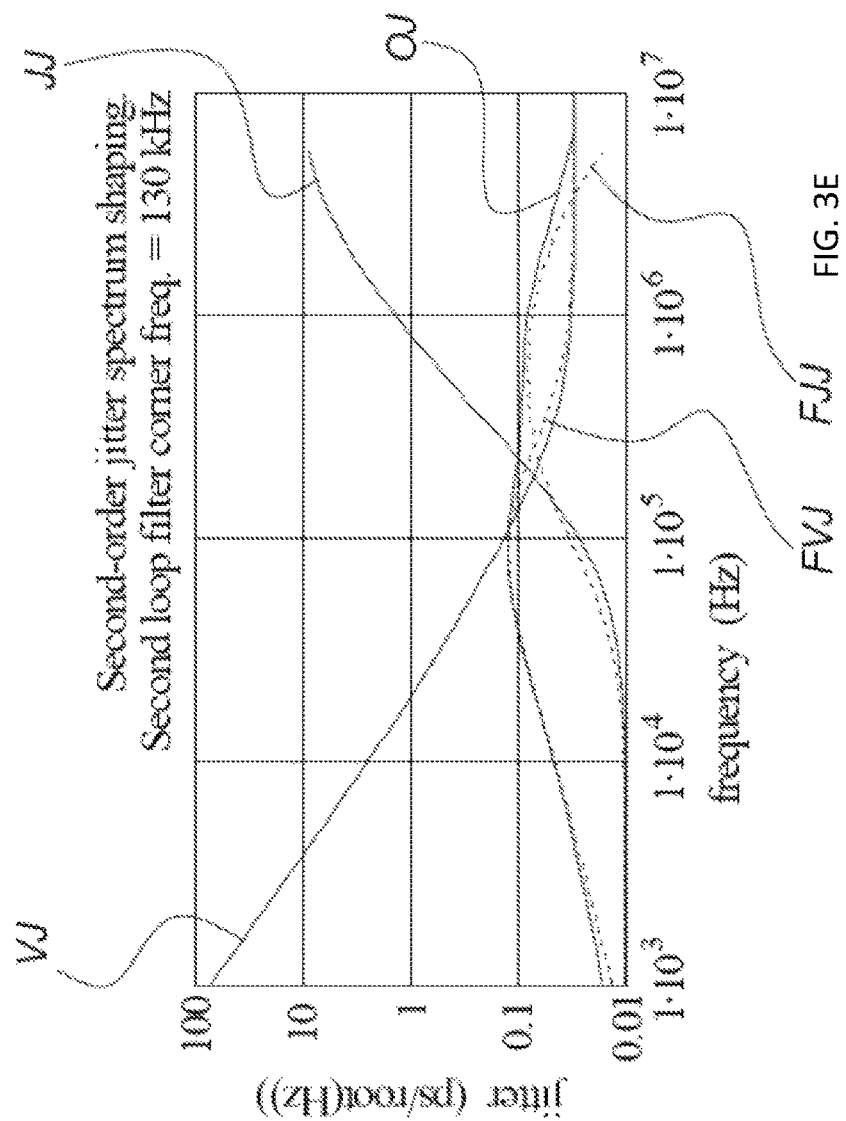

In FIGS. 3C, 3D and 3E the same simulations are performed, but now second-order noise shaping is carried out in the fractional frequency divider NCO. The corner frequency of the second loop filter SLF is 10 kHz, 100 kHz and 130 kHz in these three simulations. The justification jitter JJ is the same for all three simulations, but compared to the 4A and 4B simulations, the effect of second-order noise shaping instead of first-order shaping is obvious. The second-order noise-shaped justification jitter JJ is more effectively pushed towards high frequencies, and the slope is steeper.

As a consequence of the better-shaped justification jitter JJ, the filtered justification jitter FJJ in simulations 3C and 3D is smaller than in the corresponding simulations 3A and 3B.

The VCO jitter VJ is still the same as in FIGS. 3A and 3B, as it is not affected by the variable parameters. Therefore also the filtered VCO jitter FVJ is the same, in the simulations with the same corner frequency.

As the intrinsic output jitter OJ is mostly the sum of the filtered justification jitter FJJ and the filtered VCO jitter FVJ, the output jitter OJ gets smaller with the second-order noise shaping of simulations 4C and 4D than with the simulations 4A and 4B, though the difference for the simulations with an inner loop corner frequency of 10 kHz is negligible Regarding the order of noise shaping performed by the factional frequency divider NCO, it can be concluded that higher order is better, at least up to the point where the order matches that of the closed-loop response roll-off of the inner loop. The disadvantage of this is of course a more expensive circuit. With regards to the choice of a corner frequency for the inner loop, the conclusion is that a compromise must be made. Lower corner frequencies give more attenuation of the justification jitter JJ but less attenuation of the VCO jitter VJ. Conversely, higher corner frequencies give more attenuation of the VCO jitter VJ but less attenuation of the justification jitter JJ. A qualified pick of corner frequency, is a frequency close to where the VCO jitter graph VJ intersects with the justification jitter graph JJ.

Simulation 4E shows the result of such a qualified compromise with regards to choosing a corner frequency for the inner feedback loop. The corner frequency is set to 130 kHz, and the fractional frequency divider NCO provides second-order noise shaping. The spectral density of the output jitter OJ is the best compared to the other simulations 4A-4D, as seen from a signal-to-noise-ratio point of view. The output jitter OJ peak density in simulation 4E is approximately thirty times smaller than the output jitter OJ peak density of the simulations 4A and 4C where the corner frequency is 10 kHz. At the same time, this peak appears at approx. 100 kHz in simulation 4E, while it appears at approx. 5 kHz in simulations 4A and 4C. The latter is by far the worst regarding e.g. audio and video applications.

Another important aspect, when considering the bandwidth of the inner feedback loop, is the sensitivity of the circuit to interference from supply noise, substrate noise, capacitive and inductive crosstalk, vibration etcetera. Feedback moderates all of these effects, which argues for making the inner loop bandwidth as high as possible, within the other constraints.

Because it divorces the inner loop bandwidth from the reference jitter attenuation, the Hybrid Synchronizer enables robust designs with large amounts of feedback disciplining the voltage-controlled oscillator.

Through the above description of the Hybrid Synchronizer, a fractional frequency divider NCO has been comprised with the first block FBLK. A fractional frequency divider is a process or circuit that is clocked by a master clock and generates an event clock. These clocks are typically rectangular waveforms. The edges of the event clock are justified (i.e. aligned) to edges or interpolated phases of the master clock. A numeric control input sets the frequency or period of the event clock, relative to that of the master clock, with arbitrarily high precision. Fractional frequency dividers as outlined above have also been referred to as digitally-controlled oscillators and number-controlled oscillators.

Fractional Frequency Dividers

Figure 4:
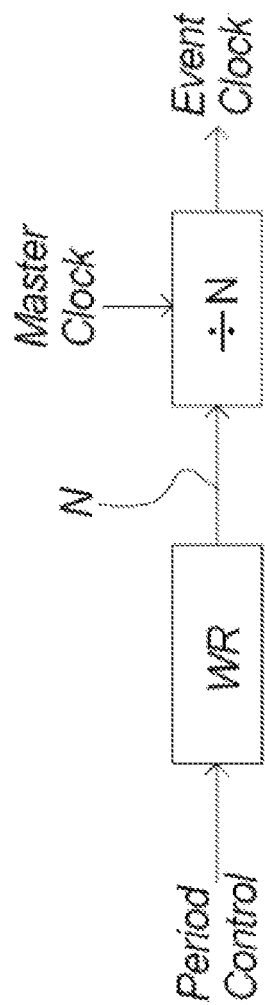
FIG. 4 illustrates a prior-art fractional frequency divider which can be used as the NCO in the present invention.

FIG. 4 shows a fractional frequency divider, which—with appropriate spectrum control—can be used in the present invention. It comprises a wordlength reducer WR, which converts non-integer period control values into integers, and a multi-modulus divider. The wordlength reducer WR can be a noise shaper, e.g. a delta-sigma modulator. The event clock is established as the master clock divided by the output N of the wordlength reducer WR. The highest possible frequency of the event clock is limited by the peak instantaneous amplitude of the noise from the noise shaper. The lowest possible frequency depends on the resolution of the period control, and has no theoretical limit. Such fractional frequency dividers give a large amount of control over the jitter spectrum. This has made them popular in fractional-N frequency synthesis where clock purity is important. One disadvantage of such fractional frequency dividers is that the noise introduced by the wordlength reducer WR gets integrated by the divider before it appears as jitter. Hence e.g. a third-order noise shaper is required to achieve second-order jitter shaping. Another disadvantage is that the peak instantaneous jitter is not tightly bounded, again due to the integrating action of the divider.

Figure 5:
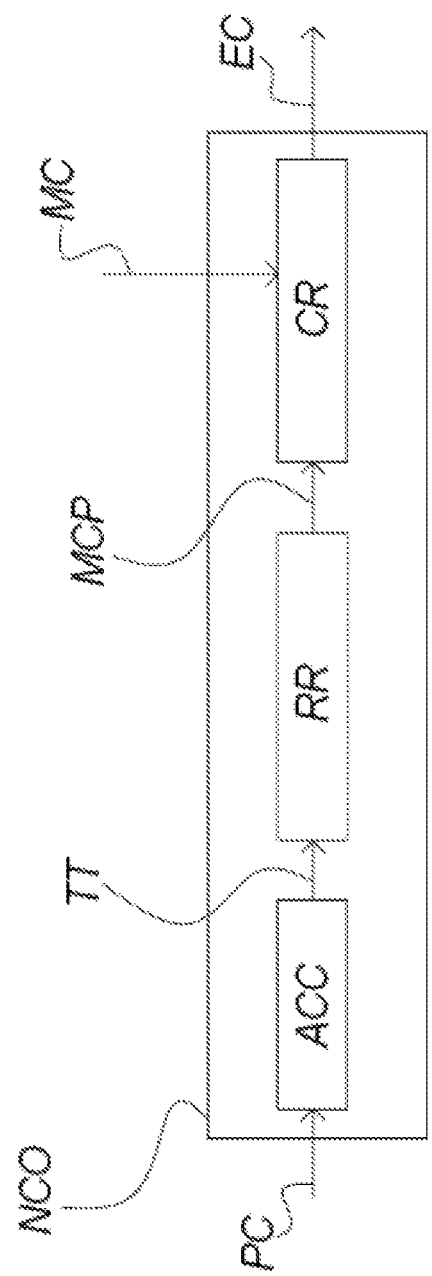
FIG. 5 shows another circuit which can be used as the NCO in the present invention.

FIG. 5 shows another possible embodiment of the fractional frequency divider in the present invention. It comprises an accumulator ACC, a resolution reducer RR and a clock renderer CR, all placed sequentially along the signal path from a period control signal PC to an event clock signal EC. The signal between the accumulator ACC and the resolution reducer RR is a stream of target times TT, and the signal between the resolution reducer RR and the clock renderer CR is a stream of master-clock pointers MCP. In addition to its master-clock pointers input MCP, the clock renderer CR also receives a master clock MC.

Because the resolution reduction is done after the accumulation, the associated quantization error does not get integrated before it appears as jitter. Hence e.g. second-order jitter spectrum shaping requires only a second-order noise shaper.

The master clock MC may e.g. comprise a square clock signal, a multiphase clock or other kinds of suitable clock forms. The period control value PC has an integer part and a fractional part. The period control PC denotes the number of master clock MC periods for each ideal output period, though the edges of the real output event clock EC must follow edges of the master clock MC. The output event clock EC is thereby typically a rectangular clock signal with mean frequency equal to the frequency of the master clock MC divided by the value given as period control PC.

The accumulator ACC is triggered by the event clock EC. This means that the accumulator ACC performs an accumulation at each event clock EC period. Thereby the target times TT indicate the times, expressed with respect to a rising count of master clock MC edges, that an ideal output clock event should occur. As the accumulator ACC naturally not has infinite resolution, its output target times TT will have a maximum value, e.g. 8.0, after reaching which they automatically wrap around, starting from 0.0 again. The accumulator ACC may be considered equivalent to an integrator.

A main purpose of the resolution reducer RR is to reduce the resolution, by e.g. truncation or rounding, of the non-integer valued target times TT to integer valued master-clock pointers MCP. Many different embodiments of the resolution reducer RR are possible. Our preferred embodiments include error feedback to shape the quantization error, and hence the jitter, produced with a simple truncation.

The clock renderer CR produces an output event clock EC according to its inputs, i.e. the stream of master-clock pointers MCP and the master clock MC, by letting each master-clock pointer address its corresponding master clock MC edge or interpolated phase. Embodiments of the clock renderer CR may e.g. do this by means of counters, comparators, multiplexers or other suitable components.

Resolution Reduction

We now set out an option for the resolution reducer RR in the fractional frequency divider of FIG. 5. However, the principle applies equally to the wordlength reducer WR in the fractional frequency divider of FIG. 4.

Figure 6:
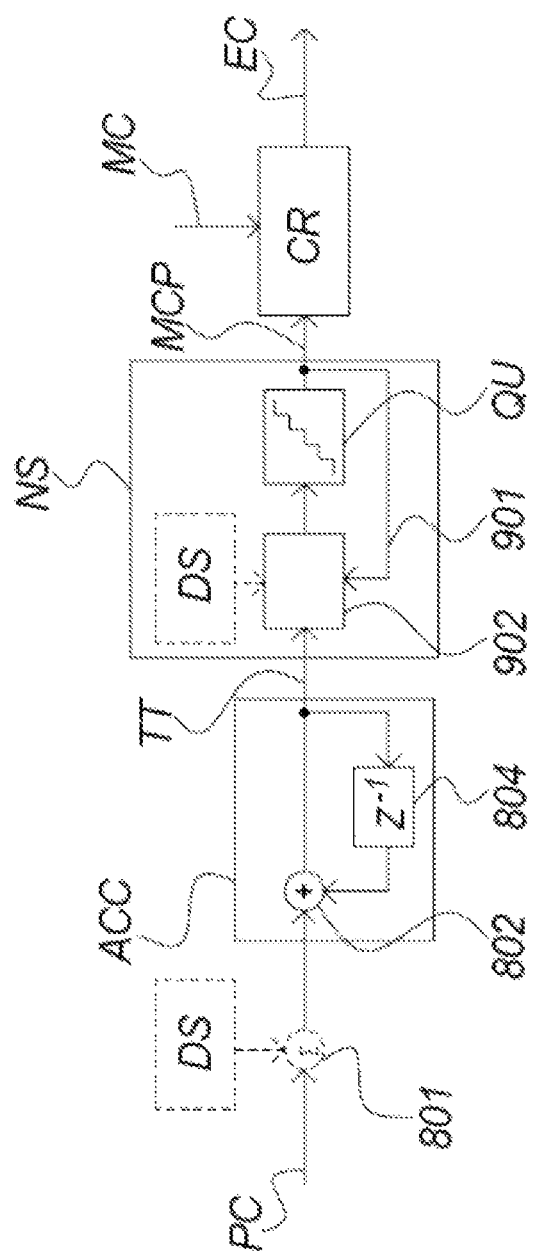
FIG. 6 illustrates how a noise shaping circuit can be used as a resolution reducer.

FIG. 6 illustrates a preferred embodiment of the accumulator ACC and resolution reducer RR, with a noise shaping circuit used as resolution reducer RR. It comprises the period control input PC, which as said is a digital or analog representation of a number comprising both an integer part and a fractional part. This period control signal PC is possibly sent to a summing point 801, where it is added to a dither signal originating from a dither source DS, before it is sent to the accumulator ACC.

The accumulator ACC comprises a summing point 802, and a delay block 804 positioned in a feedback path. The delay block 804 is triggered by the event clock EC or similar, making the accumulator ACC perform one addition per event clock EC. All signal paths within the accumulator ACC have at least the same data resolution as the period control signal PC, ensuring that the target-times signal TT is a digital or analog representation of a number with that resolution or better.

Next the target times signal TT is sent into a noise shaper NS, acting as the resolution reducer RR of FIG. 5. The noise shaper NS comprises a quantizing block QU, a noise shaping component 902 and optionally also a dither source DS. The output of the quantizing block QU is fed back to the noise shaper component 902. The output from noise shaper NS is a digital or analog representation of an integer-valued stream of master-clock pointers MCP.

The illustrated noise shaping structure 902 represents a conventional noise shaping structure, which may e.g. be a delta-sigma modulator or any other kind of noise shaping circuit. A preferred noise shaping structure 902 has a signal transfer function of unity, but noise shaping circuits with other signal transfer functions are applicable and within the scope of this invention.

The quantized signal, master-clock pointers MCP, is at last sent to the clock renderer CR together with the master clock MC. The clock renderer CR produces an event clock signal EC from the two signals MCP and MC. Because of the noise shaping of the quantizing error, and thereby of the justification jitter, the spectrum of the justification jitter is pushed towards high frequencies.

The stream of master-clock pointers MCP may be rendered to an event clock EC in many different ways. One way is to differentiate it, by subtracting the value of each pointer from that of its predecessor, and to apply the differentiated stream to the control input of a multi-modulus divider dividing the master clock MC.

Justification Jitter

Figure 7:
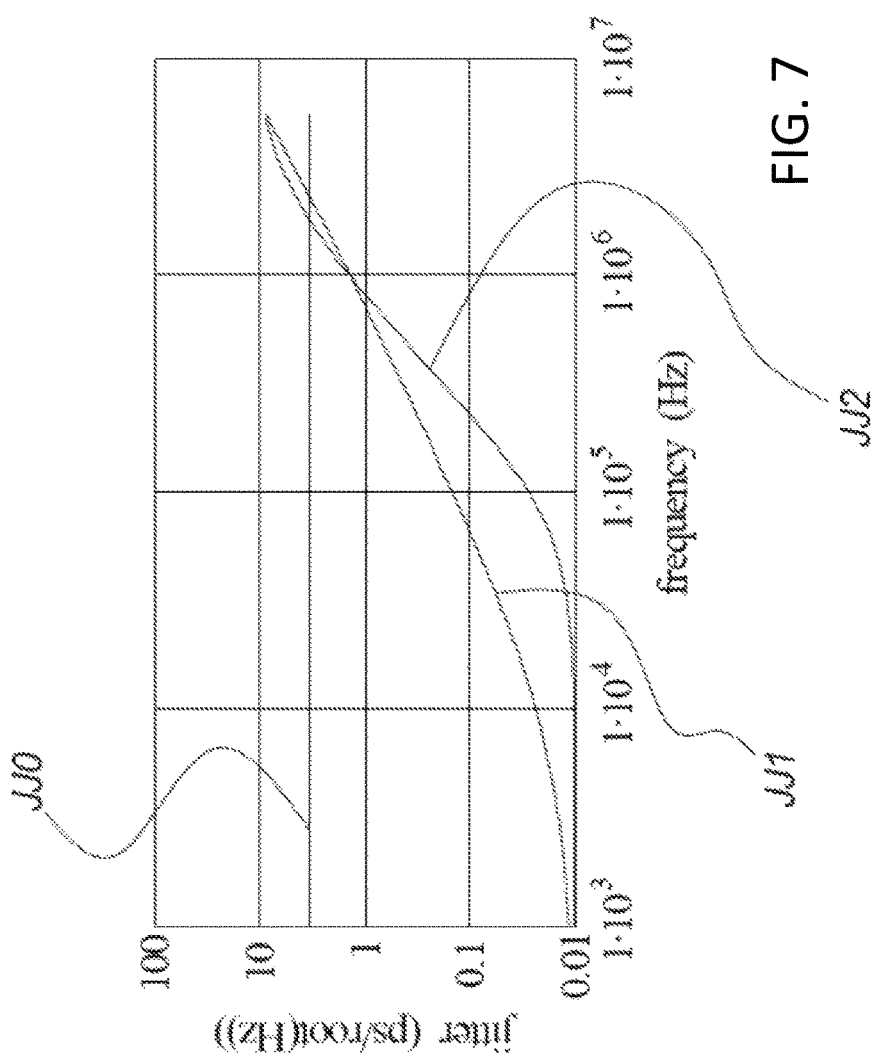
FIG. 7 shows the spectral density of the justification jitter from the NCO of FIG. 5 when different levels of noise shaping are performed.

FIG. 7 shows the results of different levels of noise shaping within the fractional frequency divider of FIG. 5. It comprises three curves JJ0 JJ1 JJ2. The horizontal axis is logarithmic, and contains frequency values measured in Hz (Hertz). The vertical axis is also logarithmic, and contains the jitter spectral density, with $$\frac{\text{ps}}{\sqrt{\text{Hz}}}$$

(picoseconds per root Hertz) as units of measure.

The first curve JJ0 shows the spectral density of the justification jitter output by the fractional frequency divider, when the resolution reducer RR incorporates just dithered quantization. The curve clearly shows that the justification jitter is then equally distributed throughout the whole spectrum.

The second curve JJ1 also shows the spectral density of the justification jitter, but this time a dithered first order noise shaping circuit is placed within the resolution reducer RR. This circuit has been configured to bias the justification jitter to higher frequencies, where it may be less troublesome and is easier to remove. It can be seen from the curve how the low frequency jitter for frequencies up to approximately 10 kHz is reduced by more than one-hundred times compared to the case without noise shaping, and how the high frequency jitter is increased instead.

The third curve JJ2 again shows the spectral density of the justification jitter, this time with a second order noise shaping circuit placed within the resolution reducer RR. It is clear that the second order noise shaping circuit is a great improvement to the first order shaping. With second order shaping the reduction is more than one-hundred times from the low frequencies to as high as 100 kHz.

Output Clock

The output clock OC is possibly a composite signal comprising both an event clock component OEC and a framing component OFS. It may have several different physical formats in different embodiments of the invention. For example, the framing component may be part of a time count. Also possible is to code the event clock and framing on a single wire.

The invention claimed is:

1. A clock synchronizer for establishing an output clock on a basis of a frequency reference, the clock synchronizer comprising:
    a first loop filter, arranged to attenuate jitter of the frequency reference to produce a numeric control signal;
    a first feedback of the output clock, arranged so that said numeric control signal is partially based on said first feedback
    a fractional frequency divider which incorporates noise shaping arranged to establish an intermediate clock by frequency-dividing the output clock on a basis of said numeric control signal;
    a second loop filter, arranged to attenuate jitter of said intermediate clock to produce an analog control signal; and
    an analog-controlled oscillator, arranged to establish the output clock on a basis of said analog control signal.

2. The clock synchronizer of claim 1, wherein said analog-controlled oscillator is a voltage-controlled oscillator.

3. The clock synchronizer of claim 1, wherein said analog-controlled oscillator is integrated on a chip.

4. The clock synchronizer of claim 1, wherein said fractional frequency divider comprises a delta-sigma modulator, whereby said noise shaping is due to delta-sigma modulation.

5. The clock synchronizer of claim 1, wherein said first loop filter forms part of an outer feedback loop, and said outer feedback loop has a loop bandwidth of at most 10 hertz.

6. The clock synchronizer of claim 1, wherein said first loop filter is driven by a first detector which is arranged to detect a frequency difference between the frequency reference and the output clock.

7. The clock synchronizer of claim 1, wherein said first loop filter is driven by a first detector which is arranged to detect a phase difference between the frequency reference and a signal derived from the output clock.

8. The clock synchronizer of claim 1, wherein said first loop filter is driven by a first detector which is arranged to detect a time difference between the frequency reference and a signal derived from the output clock.

9. The clock synchronizer of claim 1, wherein said second loop filter forms part of an inner feedback loop, and said inner feedback loop has a loop bandwidth of at least 10 kilohertz.

10. The clock synchronizer of claim 1, wherein said second loop filter is driven by a second detector which is arranged to detect a phase difference between said intermediate clock and a stable clock.

11. The clock synchronizer of claim 10, wherein said stable clock is from a free-running crystal oscillator.

12. The clock synchronizer of claim 1, wherein said clock synchronizer is integrated on a chip.

13. A method of establishing an output clock on a basis of a frequency reference, the method comprising:
attenuating jitter of the frequency reference to produce a numeric control signal;
establishing and using a first feedback of the output clock for producing said numeric control signal, so that said numeric control signal is partially based on said first feedback;
providing an intermediate clock by performing fractional frequency division of the output clock on a basis of said numeric control signal, wherein said fractional frequency division incorporates noise shaping;
attenuating jitter of said intermediate clock to produce an analog control signal; and
providing the output clock on a basis of said analog control signal.

14. The method of claim 13, wherein said step of performing fractional frequency division comprises performing delta-sigma modulation, whereby said noise shaping is due to delta-sigma modulation.

15. The method of claim 13, wherein said first feedback forms part of an outer feedback loop, and said step of attenuating jitter of the frequency reference is achieved by including an outer filtering process in said outer feedback loop.

16. The method of claim 15, further comprising operating said outer feedback loop with a loop bandwidth of at most 10 hertz.

17. The method of claim 15, further comprising detecting frequency differences between the output clock and the frequency reference.

18. The method of claim 15, further comprising detecting phase differences between the output clock and the frequency reference.

19. The method of claim 15, further comprising detecting time differences between the output clock and the frequency references.

20. The method of claim 13, wherein said step of performing fractional frequency division of the output clock forms part of an inner feedback loop, and said step of attenuating jitter of said intermediate clock is achieved by including an inner filtering process in said inner feedback loop.

21. The method of claim 20, further comprising operating said inner feedback loop with a loop bandwidth of at least 10 kilohertz.

22. The method of claim 20, further comprising operating said inner feedback loop as a phase-locked loop.

23. The method of claim 13, further comprising detecting phase differences between said intermediate clock and a stable clock.

* * * * *